United States Patent [19]
Smith

[11] Patent Number: 5,979,892
[45] Date of Patent: Nov. 9, 1999

[54] CONTROLLED CILIA FOR OBJECT MANIPULATION

[75] Inventor: Donald L. Smith, Palo Alto, Calif.

[73] Assignee: Xerox Corporation, Stamford, Conn.

[21] Appl. No.: 09/078,524

[22] Filed: May 15, 1998

[51] Int. Cl.$^6$ ................................. B65H 5/02
[52] U.S. Cl. ............................. 271/267; 271/84
[58] Field of Search ................ 271/267, 84; 198/630, 198/771

[56] References Cited

U.S. PATENT DOCUMENTS

| | | |
|---|---|---|
| 4,320,438 | 3/1982 | Ibrahim et al. . |
| 4,423,401 | 12/1983 | Mueller . |
| 4,758,927 | 7/1988 | Berg . |
| 5,121,298 | 6/1992 | Sarma et al. . |
| 5,152,695 | 10/1992 | Grabbe et al. . |
| 5,280,139 | 1/1994 | Suppelsa et al. . |
| 5,467,975 | 11/1995 | Hadimioglu et al. . |
| 5,613,861 | 3/1997 | Smith et al. ............ 439/81 |
| 5,665,648 | 9/1997 | Little . |

FOREIGN PATENT DOCUMENTS

| | | |
|---|---|---|
| 6-249880 | 9/1994 | Japan . |
| 9409374 | 4/1994 | WIPO . |
| 9641506 | 12/1996 | WIPO . |

OTHER PUBLICATIONS

K. Bohringer, "Computational Methods for Design and Control of MEMS Actuator Array," Sep. 12, 1997, Abstract from Seminar.

A. Lee, J. Hamilton, J. Trevino, "A Low Power, Tight Seal, Polyimide Electrostatic Microvalve," Micro–Electro–Mechanical Systems ASME, Dynamic Systems and Control Division Publication, v. 56, pp. 345–349, Nov. 17, 1996.

A.E. "Bill" Corwith, "Probing at Die Level," *Advanced Packaging*, Jan./Feb. 1995, pp. 26 & 28.

IBM Technical Disclosure vol. 34, No. 7B, Dec. 1991.

Donald L. Smith et al., "Flip–Chip Bonding on 6–um Pitch using Thin–Film Microspring Technology," to be published in Proc. 48$^{th}$ Electronic Components and Technology Conf., May 1998.

Donald L. Smith et al., "A New Flip–Chip Technology for High–Density Packaging," *Proc. 46$^{th}$ Electronic Components and Technology Conf.*, May, 1996.

Donald L. Smith et al., "A New High–Compliance Flip–Chip Technology," Display Works Conference, Feb. 1996.

*Primary Examiner*—David H. Bollinger
*Attorney, Agent, or Firm*—Oliff & Berridge, PLC

[57] ABSTRACT

Controlled cilia are provided to move an object. Each of the cilia, which are made of an elastic material, are fixed over a substrate and moved between a relaxed position away from the substrate and a retracted position near the substrate to move an object relative to the substrate. The cilia are moved between the relaxed and retracted positions by an electrostatic force or heating of the cilia. The cilia are formed from a material that is initially fixed to a substrate and has an inherent stress gradient. A portion of the material is released from the substrate and the inherent stress gradient forces a free portion of the cilia away from the substrate.

18 Claims, 7 Drawing Sheets

CONTROLLED CILIA FOR OBJECT MANIPULATION

BACKGROUND OF THE INVENTION

1. Field of Invention

This invention generally relates to controlled cilia, or spring claw fingers, for object manipulation.

2. Description of Related Art

Various systems exist for moving objects, such as pieces of paper, semiconductor wafers, etc. For example, pieces of paper in a copier are moved by rollers, belts, wheels and other moving devices. Similarly, semiconductor wafers are often moved by robots or air-driven transport devices as part of the manufacturing process for creating integrated circuits and the like. In the semiconductor wafer processing context, robotic and other devices are typically complex machines with many moving parts and present a contamination risk. Contamination of a semiconductor wafer processing environment can be caused by escaped lubricants, dust or other particles that are dislodged or transported by moving air from robotic devices or air transport mechanisms, or particles generated or otherwise released by friction or other contact between two moving surfaces.

SUMMARY OF THE INVENTION

Accordingly, this invention provides a locomotion device that has a minimal number of different kinds of moving parts that pose a minimal contamination risk.

The invention also provides controlled cilia, or spring claw fingers, that move between a first position near a substrate to a second position away from the substrate and engage with a surface of an object while moving between the first position and the second position to move the object relative to the substrate.

In one aspect of the invention, the claw fingers are manufactured by microlithography processes, which allow large arrays of fingers to be made inexpensively.

In one aspect of the invention, the claw fingers are controlled by an electrostatic force between the claw fingers and the substrate.

In one aspect of the invention, the claw fingers are controlled by passing an electrical current through the claw fingers.

The invention also provides a locomotion device comprising claw fingers fixed to a substrate. Each claw finger has an anchor portion fixed over the substrate and a free portion that moves between a first position near the substrate and a second position away from the substrate.

In one aspect of the invention, a controller supplies an electrical current or voltage to the locomotion device to move the claw fingers between the first and second positions.

In one aspect of the invention, each claw finger comprises a material that is fixed over the substrate so that an inherent stress gradient is formed in the material. When a free portion of the claw finger, which is initially fixed to the substrate, is released from the substrate, the inherent stress gradient in the material biases the free portion to move away from the substrate.

In one aspect of the invention, each claw finger is formed of a plurality of layers that are fixed over a substrate so that an inherent stress gradient is formed in the layers. A free portion of the claw finger is initially fixed to the substrate. When a free portion of the claw finger is released from the substrate, the inherent stress gradient in the layers biases the free portion away from the substrate.

One aspect of the invention provides an array of claw fingers that are arranged in at least two sub-arrays to move a surface of an object relative to a substrate in at least two different directions.

BRIEF DESCRIPTION OF THE DRAWINGS

The invention will be described in relation to the following drawings in which reference numerals refer to like elements, and wherein.

DETAILED DESCRIPTION OF PREFERRED EMBODIMENTS

Figure 1:
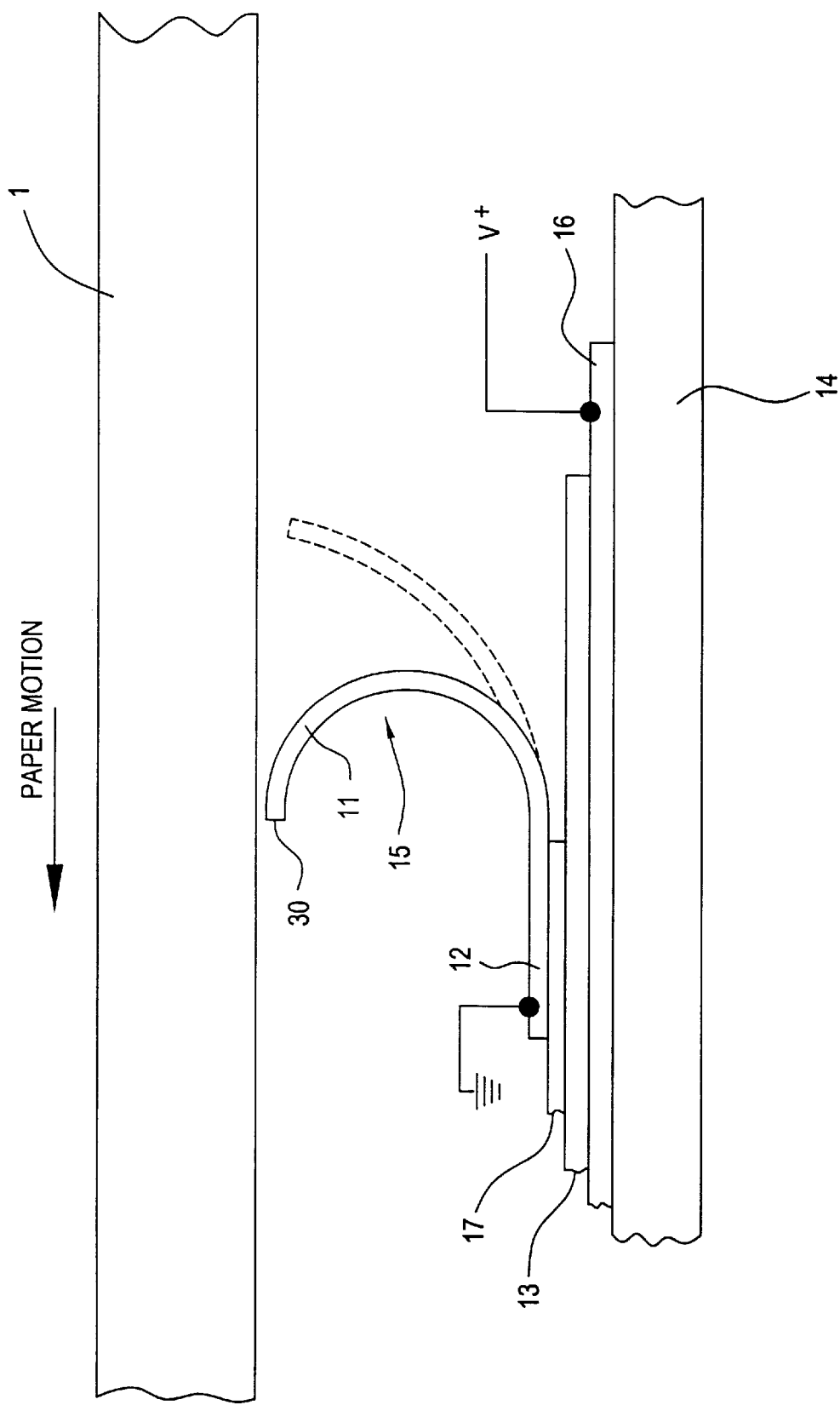
FIG. 1 shows a side-view of an electrostatically controlled claw finger in accordance with the invention.

FIG. 1 shows a side view of a claw finger 15 in accordance with a preferred embodiment of the invention. The claw finger 15, which is made of an elastic material, has a tip 30, a free portion 11 and an anchor portion 12. In its relaxed state, the claw finger 15 is in the position shown in solid lines in FIG. 1. The claw finger 15 is preferably formed on or over a sacrificial release layer 17 that is preferably formed on or over a dielectric material 13. The dielectric material 13 is preferably formed on or over an electrode 16, which is preferably formed on or over a substrate 14.

Since the claw finger 15 is preferably made from an elastic material, a force applied to the claw finger 15 is necessary to elastically deform and move the claw finger 15 from its relaxed state. In the embodiment shown in FIG. 1, the free portion 11 of the claw finger 15 moves between a retracted position near the electrode 16 (shown in dashed lines) and a relaxed position away from the electrode 16 (shown in solid lines) based on an electric potential (electrostatic force) between the electrode 16 and the free portion 11. Although the retracted position is shown as a position where the claw finger 15 just disengages from a lower surface of a paper 1, the claw finger 15 could be retracted further from the paper 1 or other object as required. In this embodiment, the free portion 11 is grounded and a voltage is applied to the electrode 16 to establish the electrostatic force and move the claw finger 15 to the retracted position. Of course, the electrode 16 could be grounded and a charge applied to the free portion 11 of the claw finger 15 to establish an electric potential. In addition, other variations will occur to those skilled in the art, such as negatively charging the free portion 11 and positively charging the electrode 16 or vice versa.

To move the paper 1 or any other object in the direction shown in FIG. 1, a voltage is preferably first applied to the electrode 16. The voltage is preferably in the range of 10 to 100 volts, but will vary depending upon the thickness, width and length of the free portion 11 of the claw finger 15, the thickness of the release layer 17 and/or the thickness of the dielectric 13, the material comprising the free portion 11 of the claw finger 15, environmental conditions such as humidity, and other factors. However, whatever the conditions, the voltage level is preferably sufficiently high to attract the free portion 11 toward the electrode 16 and overcome the spring force in the claw finger 15 that biases the claw finger 15 toward the relaxed position.

As the claw finger 15 is drawn to the retracted position, the tip 30 of the claw finger 15 preferably does not engage with the paper 1 with a high coefficient of friction because the tip 30 either does not touch the paper 1, i.e. a part of the free portion 11 contacts the paper 1, or the tip 30 forms an oblique angle with the surface of the paper 1. Thus, the claw finger 15 preferably either does not engage with the paper 1 or engages with the paper 1 with insufficient frictional force to move the paper 1 to the right as shown in FIG. 1. Alternatively, the claw finger 15 could engage with the paper 1 with a frictional force to move the paper 1 as the claw finger 15 moves to the retracted position. In this case, the paper 1 preferably moves further in a leftward direction when the claw finger 15 moves from the retracted position to the relaxed position than in a rightward direction as the claw finger 15 is retracted. As an additional possibility, if the claw finger 15 is intended to vibrate the paper 1 or other object without moving the object substantially in any direction overall, the claw finger 15 could engage with the paper 1 or other object with an equal force, or the object could move approximately equally in both directions, when the claw finger 15 moves from the retracted position to the relaxed position and from the relaxed position to the retracted position, to thereby vibrate the paper 1 or other object.

Once the free portion 11 of the claw finger 15 has moved sufficiently toward the electrode 16 and reaches a desired retracted position, the electric bias on the electrode 16 is preferably either removed or reversed to relieve the attractive force between the free portion 11 and the electrode 16. Of course, the electrode 16 could be reversed-biased so that a repulsive electrostatic force is generated between the electrode 16 and the free portion 11. In response, elastic energy stored in the claw finger 15 causes the free portion 11 to spring away from the electrode 16, and the tip 30 of the claw finger 15 engages with a lower surface of the paper 1. Preferably, the tip 30 engages with the paper 1 at an acute angle without slipping or any relative movement between the paper 1 and the tip 30. If the claw finger 15 slips, or moves relative to the paper 1, the coefficient of friction between the tip 30 and the paper 1 is preferably higher when the claw finger 15 moves from the retracted position to the relaxed position than when the claw finger 15 moves from the relaxed position to the retracted position. Thus, the claw finger 15 moves the paper 1 or other object leftward as shown in FIG. 1. As discussed above, if the claw finger 15 is intended to vibrate the paper 1, the coefficient of friction between the claw finger 15 and the paper 1 is approximately equal, or the movement of the paper 1 is approximately equal, for both movements of the claw finger 15, i.e. in both retraction and recovery.

Accordingly, the tip 30 of the claw finger 15 exerts a force on the surface of the paper 1 generally toward the left as shown in FIG. 1, thereby moving the paper 1 leftward. Although the force exerted on the paper 1 or other object by a single claw finger 15 is relatively small, the combined force of several hundreds or thousands of claw fingers 15 on the paper 1 is sufficient to move the paper 1 in a desired direction. It has been estimated that the claw finger 15 or an array of claw fingers 15 can exert a force of approximately 1 gram/mm$^2$.

Although in the above description the stored elastic energy in the claw finger 15 is used to move the paper 1 or other object, an electrostatic force or other force or mechanism can supplement the force of the claw finger 15 on the paper 1 in both the retraction and recovery movements of the claw finger 15.

Figure 2:
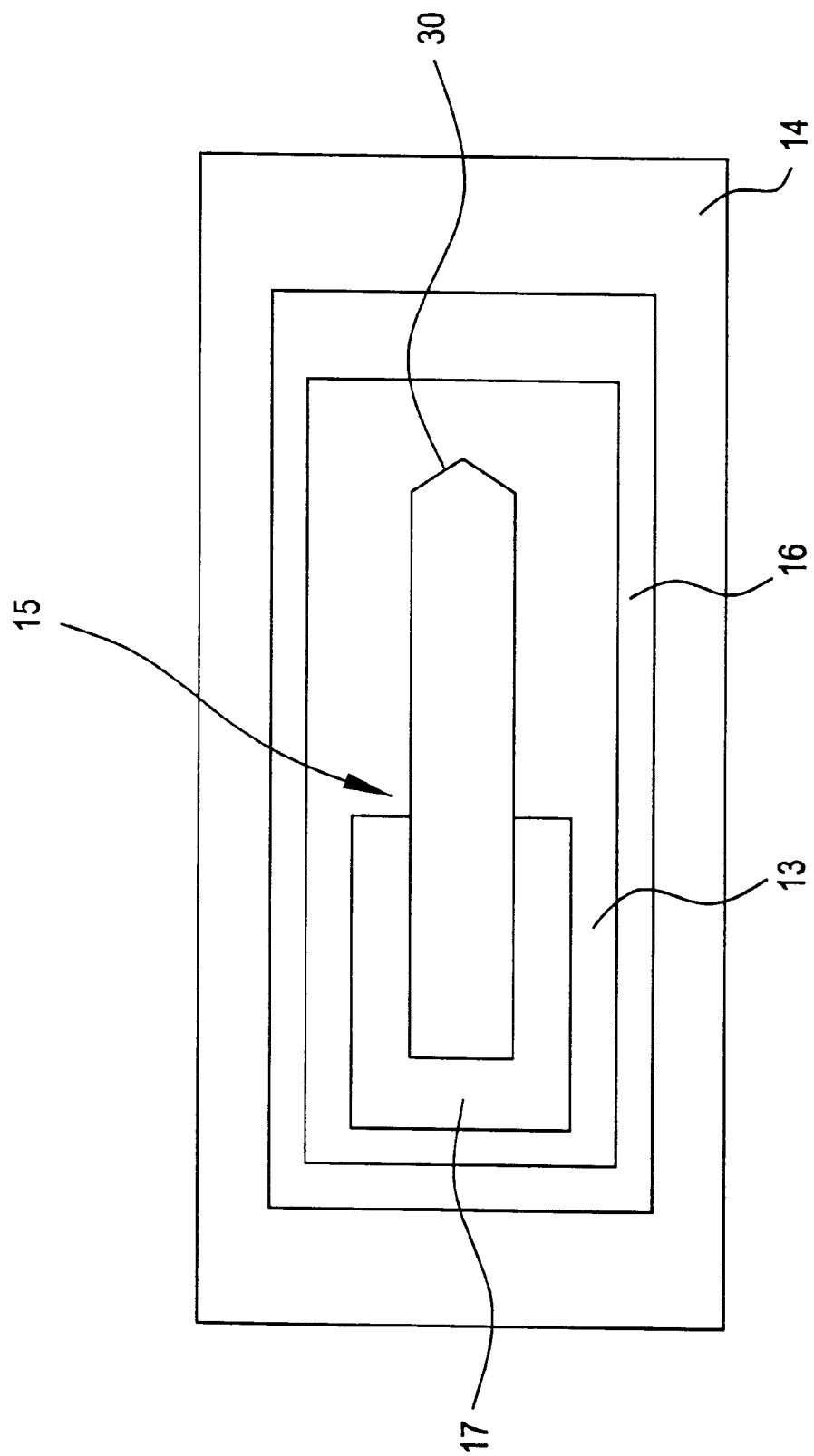
FIG. 2 shows a top-view of a claw finger in accordance with the invention.

FIG. 2 shows a top view of the claw finger 15. The claw finger 15 has a generally rectangular shape with a pointed tip 30. However, other configurations are possible, as will be discussed more fully below.

Figure 3:
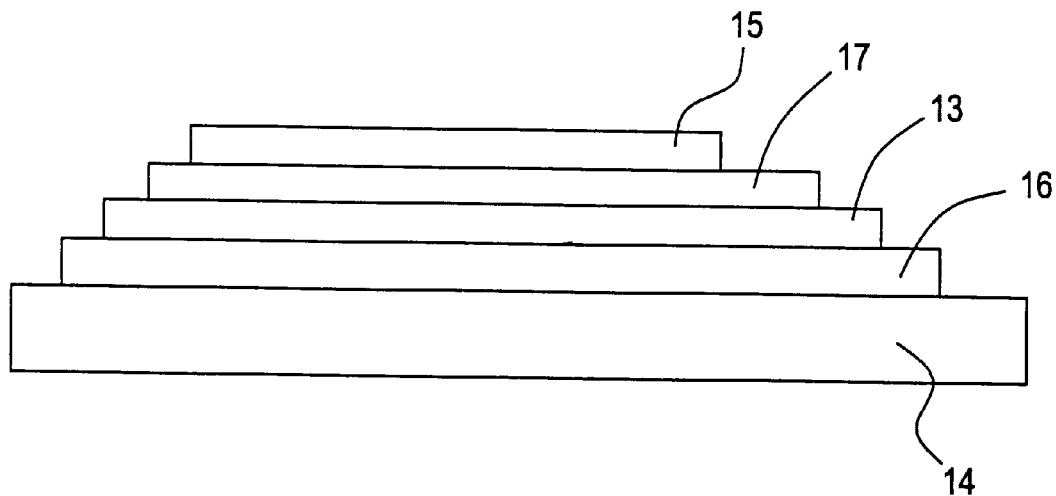
FIGS. 3 and 4 show steps for forming a claw finger in accordance with a preferred embodiment of the invention.
Figure 4:
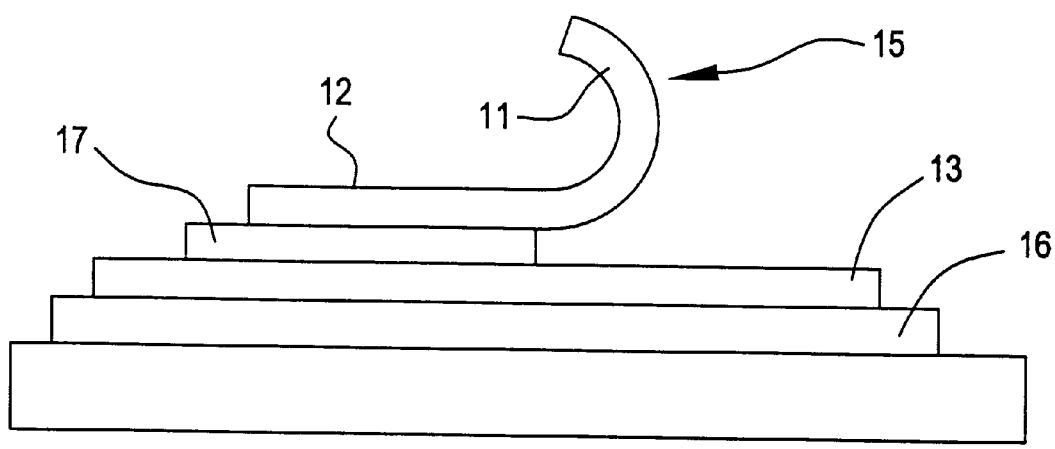

FIGS. 3 and 4 show steps for forming a claw finger 15. Only a general description of a preferred process for forming the claw finger 15 is provided in connection with FIGS. 3 and 4. Details regarding the preferred process for forming the claw finger 15 are provided in U.S. Pat. No. 5,613,861 to Smith et al., filed Jun. 7, 1995, and U.S. patent application No. 08/990,508, filed Dec. 15, 1997, which are both herein incorporated by reference in their entirety.

FIG. 3 shows an initial processing stage of a preferred method for constructing a preferred embodiment of the invention. Other methods of manufacture will occur to those of skill in the art. First, the electrode 16 is formed on a glass substrate 14. The electrode 16 is preferably made of aluminum having a thickness of 0.1 microns to 1 micron. However, the electrode 16 can be made of any conductive metal or other material, such as titanium, tungsten, copper, etc. The electrode 16 layer is then patterned into a desired electrode configuration, as discussed more fully below.

Next, a dielectric 13 is formed on the electrode 16. The dielectric 13 is preferably made of silicon nitride or silicon oxynitride and has a thickness of approximately 0.3 microns to 1 micron. The dielectric 13 can also be made of tantalum oxide or aluminum oxide that are sputter deposited or grown on tantalum or aluminum electrodes 16 by anodic oxidation. When the dielectric 13 is grown on an existing electrode 16, the need to deposit an additional layer of material over the electrode 16 is eliminated since the dielectric 13 is formed from the electrode 16. The necessary thickness for the dielectric 13 depends upon the voltage potential required between the electrode 16 and the claw finger 15 to move the claw finger 15 from the relaxed position toward the electrode 16. That is, the dielectric 13 must be thick enough to prevent electrical breakdown when the electrode 16 and/or the claw finger 15 are electrically charged. In a preferred configuration, the dielectric 13 must be capable of withstanding a field strength of approximately 1 MV/cm. The thickness of the dielectric 13 also depends upon the material used to make the dielectric 13 layer. In general, any suitable dielectric material can be used to make the dielectric 13 layer.

Next, a sacrificial release layer 17 is formed on the dielectric layer 13. Preferably, the release layer 17 is plasma-deposited silicon nitride. The claw finger 15 is then formed over the sacrificial release layer 17. As discussed in the incorporated references, the claw finger 15 can be made of a nickel-zirconium alloy, a chrome-molybdenum alloy, or other elastic materials, including conductive, semi-conductive and non-conductive materials. Although the incorporated references explicitly describe forming claw fingers from a single type of material, one of ordinary skill in the art will appreciate that a single claw finger 15 can be made of layers of different materials. For example, a claw finger 15 can be formed from a silicon nitride layer on which is deposited a layer of nickel-zirconium alloy. All that is required in the preferred method is that the material that forms the claw finger 15 be deposited on the release layer 17 so that an inherent stress gradient is formed in the claw finger 15. The inherent stress gradient can be caused by different deposition conditions, such as plasma gas pressure, temperature, etc., or thermal expansion/contraction effects, or mechanical working.

FIG. 4 shows another step in the preferred method for constructing of the claw finger 15 where a portion of the claw finger 15 is released from the release layer 17. An anchor portion 12 of the claw finger 15 remains fixed to the release layer 17, but the free portion 11 curves up and away from the dielectric 13 when released due to the inherent stress gradient in the claw finger 15. The free portion 11 is preferably released from the release layer 17 by etching the release layer 17 with an HF etchant. Thus, the claw finger 15 and dielectric 13 are preferably made from material that is either not etched, or etched at a relatively slow rate, by the HF etchant.

Other methods of releasing the free portion 11 can be used, however. For example, the release layer 17 could be made of a thermoplastic material that is heated and melted to release the free portion 11. Another option is to not provide the release layer 17 between the dielectric 13 and the claw finger 15. In this case, the dielectric 13 would be under-cut etched or otherwise removed or melted to release the free portion 11 from the dielectric 13. It is also possible that the free portion 11 could be mechanically removed from the dielectric 13, however damage to the claw finger 15 may result.

In a preferred configuration, the claw finger 15 has a thickness of 2 microns, a width of 200 microns and a length of 500 microns. However, other configurations are possible, and since the claw fingers 15 are preferably formed using microlithographic techniques, the claw fingers 15 can be formed into almost any desired shape.

Figure 7:
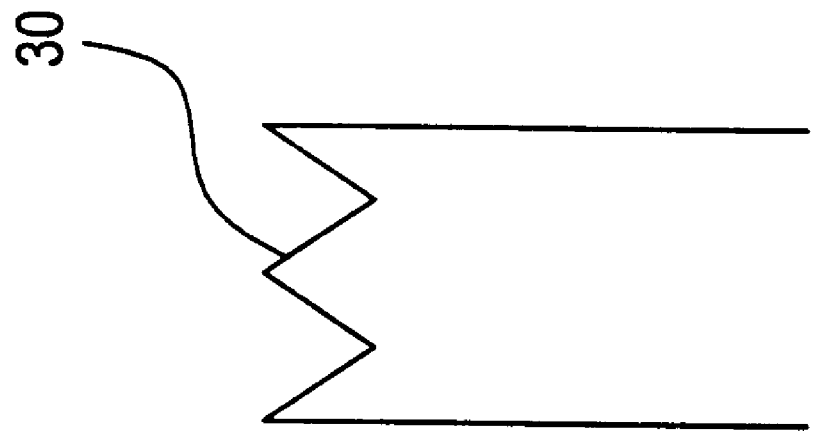
FIGS. 5–7 show optional tip configurations for the claw fingers.
Figure 6:
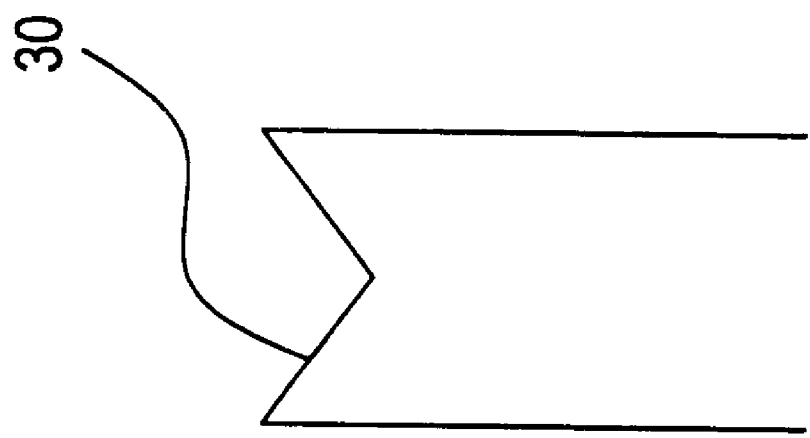
Figure 5:
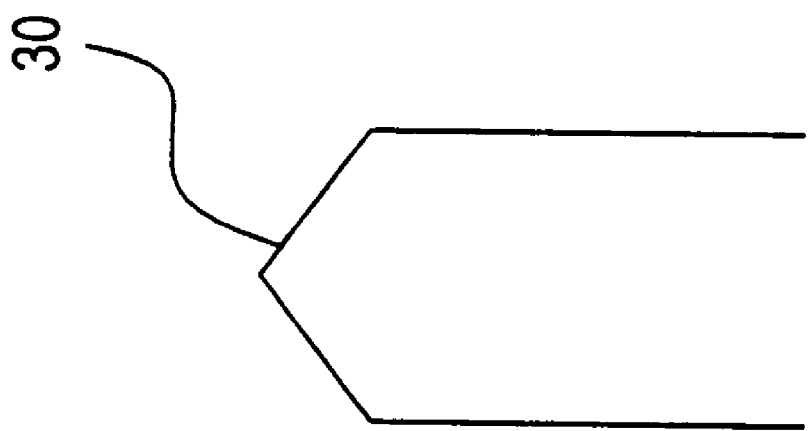

The above description regarding the construction and configuration of the claw finger 15 is exemplary only and should not be construed as limiting the invention. For example, the dielectric 13 could be eliminated and the electrode 16 imbedded in the substrate 14. In this alternate configuration, the portion of the substrate 14 between the electrode 16 and the claw finger 15 would serve as the dielectric. Likewise, although the claw finger tip 30 has been described as having a single point as shown in FIG. 5, the tip 30 can be changed to meet any desired requirements. For example, FIGS. 6 and 7 show two alternate tip configurations that have two and three points, respectively. Multiple tip configurations may be desired in situations where an increased contact area between the claw fingers 15 and the paper 1 or other object is necessary. In contrast, a claw finger 15 having a flat tip 30, i.e., a tip 30 without any points, may be desired in other applications.

Figure 8:
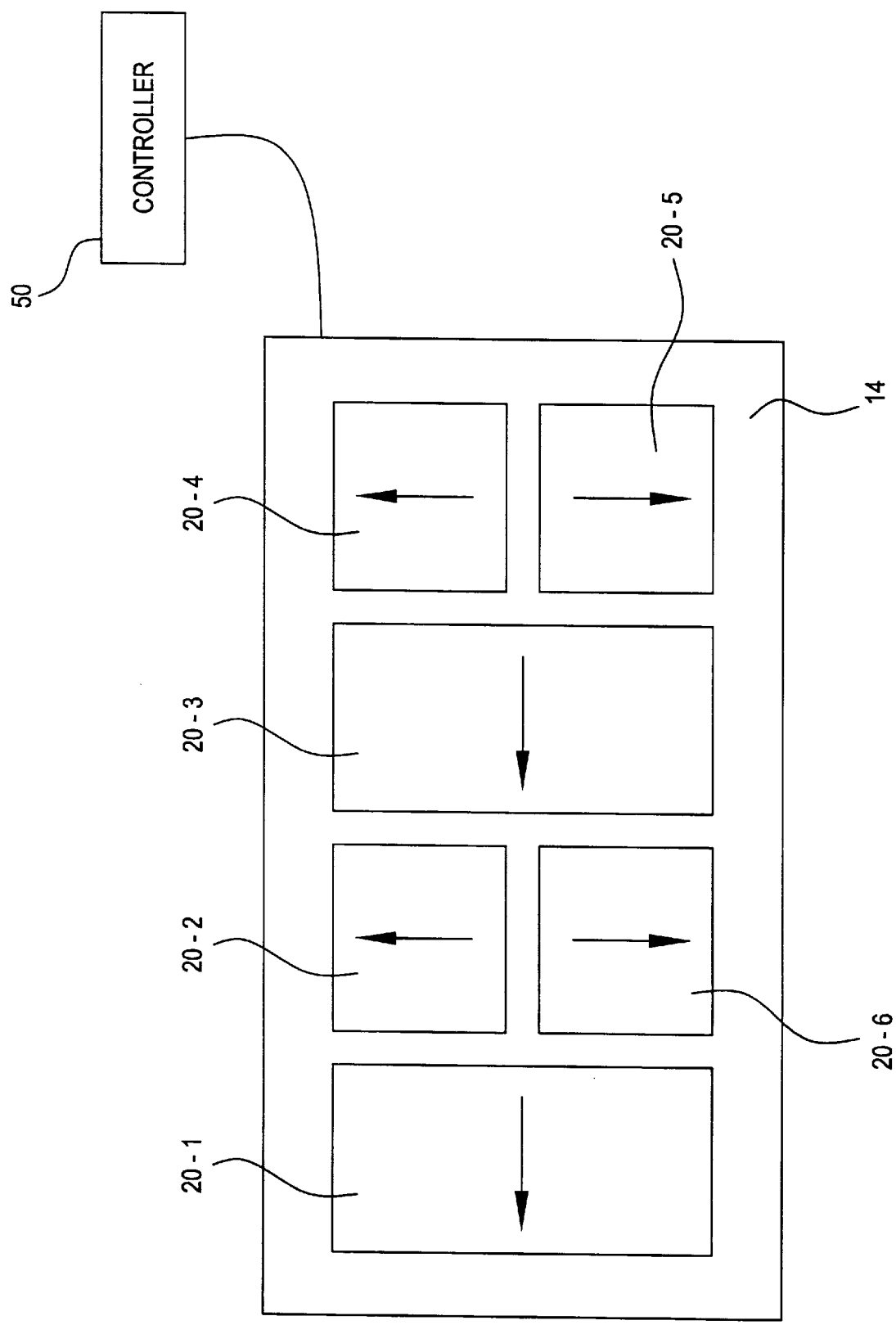
FIG. 8 shows an example claw finger array configuration.

FIG. 8 shows an example claw finger 15 array formed on a substrate 14. The claw finger arrays 20 can be used to move an object, such as a piece of paper 1, relative to the substrate 14, or to move the substrate 14 relative to another surface, such as a floor. The arrows shown in FIG. 8 indicate the direction that the claw finger arrays 20 move an object relative to the substrate 14. For example, the arrays 20-1 and 20-3 move an object to the left as shown in FIG. 8. The arrays 20-2 and 20-4 move in an object upward, and the arrays 20-5 and 20-6 move an object downward as shown in FIG. 8.

Each of the arrays 20 communicate with and are controlled by a controller 50. The controller 50 is preferably a general purpose computer that is programmed and has appropriate circuitry to supply the appropriate control voltages and/or currents to the arrays 20. The controller 50 can also be implemented as a single special purpose integrated circuit (e.g., ASIC) each having a main or central processor section for overall, system-level control, and separate sections dedicated to performing various different specific computations, functions and other processes under the control of the central processor section. The controller 50 can also be implemented using a plurality of separate dedicated or programmable integrated or other electronic circuits or devices, e.g., hardwired electronic or logic circuits such as discrete element circuits or programmable logic devices. In general, any device or assembly of devices capable of providing appropriate control signals to the arrays 20 can be used.

The controller 50 activates each array 20 by supplying an appropriate control signal to each array 20, e.g., a signal that causes the electrode 16, or electrodes 16 that correspond to each array 20, to be electrically charged. That is, the controller 50 can directly supply the necessary electrical signal to the electrode 16 to activate the claw fingers 15 in an array 20, or the controller 50 can supply another signal to the array 20 that causes other control circuitry, such as a relay, to cause the electrode 16 to become charged.

As an example, the arrays 20 in FIG. 8 can be controlled by the controller 50 to move an object (not shown) to the left and upward as follows. First, the controller 50 applies appropriate control signals to the arrays 20-1 and 20-3 to control the claw fingers 15 to move the object to the left. Appropriate feedback detection devices, such as a mechanical sensor, photodetector, video camera or other device can supply feedback signals to the controller 50 so that the controller 50 causes the object to be moved to a desired position. The controller 50 then controls the arrays 20-2 and 20-4 to move the object upward. Again, an appropriate position sensing device can provide feedback to the controller 50 so that the object is appropriately positioned.

Preferably, the controller 50 drives the claw fingers 15 in an array 20 at the claw fingers' 15 resonant frequency. That is the controller 50 applies control signals to the arrays 20 so that the claw fingers 15 in the array 20 vibrate between the retracted position near the substrate 14 and the relaxed position away from the substrate 14 at the resonant frequency of the claw fingers 15, which is typically in the range of 100 KHz. Of course, the controller 50 can drive the claw fingers 15 at any desired rate. Furthermore, the controller 50 need not activate all of the claw fingers 15 in an array 20 simultaneously. Instead, the electrode 16 that corresponds to each array 20 can be divided into a plurality of electrodes 16 that are each individually controllable.

Figure 9:
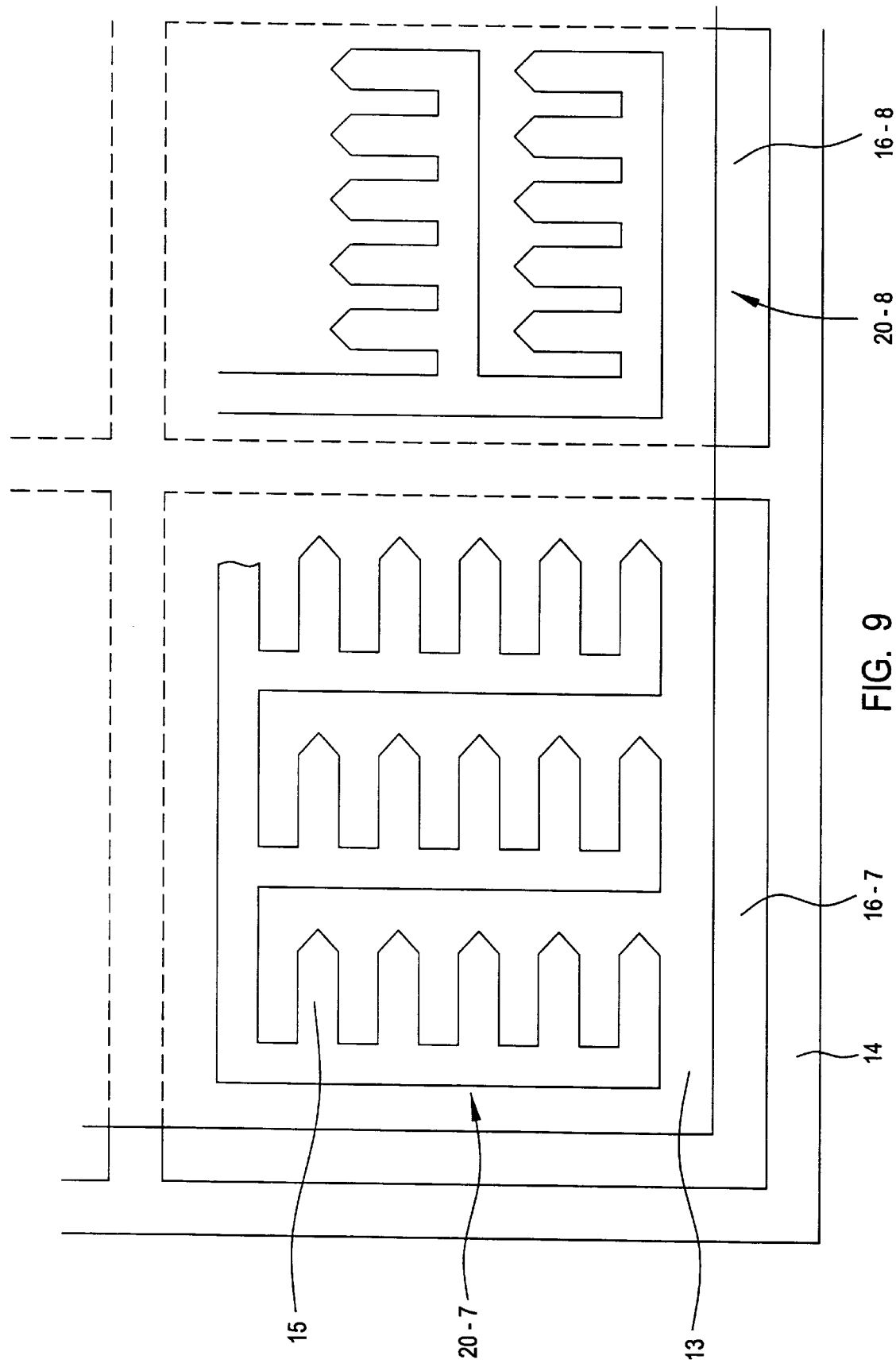
FIG. 9 shows a top view of two claw finger arrays.

FIG. 9 shows a close-up view of two arrays 20-7 and 20-8. Each of the claw fingers 15 in the arrays 20-7 and 20-8 are electrically connected to each other and commonly grounded. Each array 20-7 and 20-8 has a corresponding electrode 16-7 and 16-8 that is controlled by the controller 50. As discussed above, the electrodes 16-7 and 16-8 can be divided into multiple electrodes 16 to provide finer control of claw fingers 15 within each array 20-7 and 20-8. Although FIG. 9 shows that the claw fingers 15 are positioned perpendicular to each other, the claw fingers 15 can be arranged in other ways. For example, the claw fingers 15 can be arranged at an angle of 45° to each other. In fact, since the claw fingers 15 are formed by microlithographic processes, the claw fingers 15 can be arranged in almost any configuration.

Figure 10:
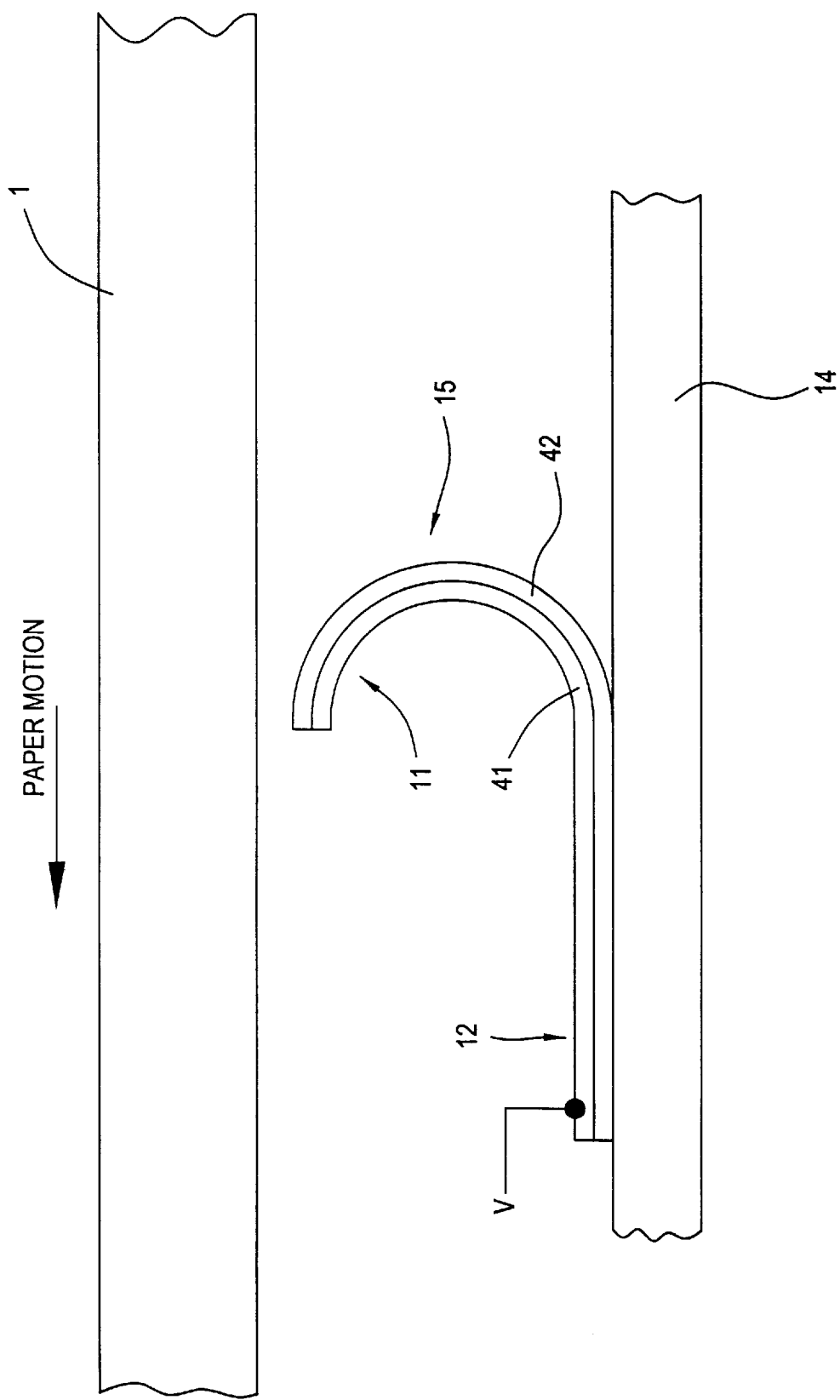
FIG. 10 shows a thermally-controlled claw finger in accordance with an embodiment of the invention.

As discussed above, the invention is not limited to configurations where the claw fingers 15 are activated by an electrostatic force between an electrode 16 and the claw finger 15. Instead, the claw fingers 15 may be thermally controlled. FIG. 10 shows a claw finger 15 that is activated by heating the claw finger 15. In the example shown in FIG. 10, an activation layer 41 is heated by passing a current through the activation layer 41. Preferably, the activation layer 41 is made of a conductive metal, such as nickel. However, the activation layer 41 can be made of other conductive and semiconductive materials. A base layer 42 is preferably formed of an insulating material, such as polyimide. As a current is passed through the activation layer 41 and the activation layer 41 is heated, the activation layer 41 expands, i.e. grows in length, faster than the base layer 42. Accordingly, the free portion 11 moves toward the substrate 14 and disengages from the paper 1. When the current flowing through the activation layer 41 is stopped, the activation layer 41 cools and the free portion 11 moves away from the substrate 14. As a result, the free portion 11 engages with the paper 1 and exerts a force on the paper 1 to move leftward as shown in FIG. 10.

Other configurations will occur to those skilled in the art, such as providing an additional activation layer 41 between the base layer 42 and the substrate 14. This additional activation layer 41 could be heated to force the free portion 11 to more forcefully bend away from the substrate 14 and move the paper 1. Furthermore, the activation layer 41 need not extend over the entire length of the claw finger 15. All that is required is that the activation layer or layers 41 appropriately move the free portion 11 so that the paper 1 is forced to move in a desired direction. The activation layer or layers 41 can also be heated by other means, such as radiation, convective or conductive heating.

As discussed above, the invention need not only be used to move paper 1 or other objects in a desired direction relative to a substrate 14. Instead, the invention can be used to move the substrate 14 relative to another surface, such as a floor. For example, arrays of claw fingers 15 can be provided on the bottom of a device that requires fine positional adjustment. By appropriately activating the claw fingers 15, the device could essentially "walk" on a surface in a highly controlled and accurate manner. The invention can also be used with other coarse positioning devices, such as wheels or belts, that roughly position the device. Once the device is in an approximate desired position, the claw fingers 15 could be used to accurately position the device.

While the invention has been described with specific embodiments, the description of the specific embodiments is illustrative only and is not to be construed as limiting the scope of the invention. Various other modifications and changes may occur to those skilled in the art without departing from the spirit and scope of the invention.

What is claimed is:

1. A locomotion device comprising:
   a substrate;
   a finger having a free portion and an anchor portion fixed over the substrate, the free portion moving between a first position near the substrate and a second position away from the substrate and engaging with an object positioned opposite the substrate to move the object relative to the substrate; and
   a controller that provides a control signal to cause the free portion to move between the first and second positions.

2. The locomotion device of claim 1, wherein the free portion moves between the first and second positions based on an electrostatic force between the free portion and the substrate.

3. The locomotion device of claim 1, wherein the free portion moves between the first position and the second position based on an electrical current in the substrate.

4. The locomotion device of claim 1, wherein the free portion moves between the first position and the second position based on an electrical current in the finger.

5. The locomotion device of claim 1, wherein the finger is heated to move the free portion between the first and second positions.

6. The locomotion device of claim 1, wherein the finger is formed by a method comprising the steps of:
   fixing a material over the substrate so that an inherent stress gradient is formed in the material; and
   releasing a portion of the material from the substrate so that the free portion is biased by the inherent stress gradient to move away from the substrate.

7. The locomotion device of claim 1, wherein the finger is formed by a method comprising the steps of:
   fixing a first layer over the substrate;
   fixing a second layer over the first layer so that an inherent stress gradient is produced in the layers; and
   releasing a portion of the first layer from the substrate so that the inherent stress gradient biases the free portion to move away from the substrate.

8. A locomotion device of claim 1, wherein the substrate comprises an electrode that is electrically connected to the controller.

9. The locomotion device of claim 8, wherein the substrate further comprises:
   a dielectric positioned between the electrode and the finger; and
   the fingers are electrically grounded.

10. A locomotion device comprising:
    a substrate;
    fingers arranged in at least two sub-arrays, each finger having a free portion connected to an anchor portion that is fixed over the substrate, the free portion moving between a first position near the substrate and a second position away from the substrate to engage with and move an object relative to the substrate; and
    a controller that provides a control signal that causes the fingers in each sub-array to selectively move between the first and second positions.

11. The locomotion device of claim 10, wherein the free portion moves between the first and second positions based on an electrostatic force between the free portion and the substrate.

12. The locomotion device of claim 10, wherein the free portion moves between the first position and the second position based on an electrical current in the substrate.

13. The locomotion device of claim 10, wherein the free portion moves between the first position and the second position based on an electrical current in the finger.

14. The locomotion device of claim 10, wherein the finger is heated to move the free portion between the first and second positions.

15. The locomotion device of claim 10, wherein the finger is formed by a method comprising the steps of:
    fixing a material over the substrate so that an inherent stress gradient is formed in the material; and
    releasing a portion of the material from the substrate so that the free portion is biased by the inherent stress gradient to move away from the substrate.

16. The locomotion device of claim 10, wherein the finger is formed by a method comprising the steps of:

fixing a first layer over the substrate;

fixing a second layer over the first layer so that an inherent stress gradient is produced in the layers; and releasing a portion of the first layer from the substrate so that the inherent stress gradient biases the free portion to move away from the substrate.

17. A locomotion device of claim 10, wherein the substrate comprises an electrode that is electrically connected to the controller.

18. The locomotion device of claim 17, wherein the substrate further comprises:

a dielectric positioned between the electrode and the finger; and the fingers are electrically grounded.

* * * * *